(12) United States Patent
Pyo et al.

(10) Patent No.: US 11,372,312 B2
(45) Date of Patent: Jun. 28, 2022

(54) IMAGE SENSOR INCLUDING AUTO FOCUS PIXEL

(71) Applicant: SAMSUNG ELECTRONICS CO., LTD., Suwon-si (KR)

(72) Inventors: Junghyung Pyo, Seoul (KR); Kyungho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 16/897,500

(22) Filed: Jun. 10, 2020

(65) Prior Publication Data

US 2020/0387050 A1 Dec. 10, 2020

(30) Foreign Application Priority Data

Jun. 10, 2019 (KR) ........................ 10-2019-0068276

(51) Int. Cl.
  *G03B 13/36* (2021.01)
  *G02B 7/04* (2021.01)
  *H04N 5/232* (2006.01)
  *H04N 5/222* (2006.01)

(52) U.S. Cl.
  CPC .............. *G03B 13/36* (2013.01); *G02B 7/04* (2013.01); *H04N 5/23212* (2013.01); *H04N 5/2226* (2013.01)

(58) Field of Classification Search
  CPC . G03B 13/36; G02B 7/04; G02B 7/34; H04N 5/23212; H04N 5/2226; H04N 5/36961; H04N 5/232122; H04N 5/378; H01L 27/1464; H01L 27/14605; H01L 27/14607; H01L 27/14621; H01L 27/14623; H01L 27/14627; H01L 27/1463; H01L 27/14603
  See application file for complete search history.

(56) References Cited

U.S. PATENT DOCUMENTS

| | | | |
|---|---|---|---|
| 9,876,044 B2 | 1/2018 | Lee et al. | |
| 9,883,128 B2 | 1/2018 | Banachowicz et al. | |
| 10,014,338 B2 | 7/2018 | Lee | |
| 10,249,666 B2 | 4/2019 | Pyo et al. | |
| 2017/0047363 A1 | 2/2017 | Choi et al. | |
| 2018/0047766 A1* | 2/2018 | Pyo .................. | H01L 27/14627 |
| 2018/0063456 A1* | 3/2018 | Lee .................. | H01L 27/14627 |
| 2018/0158864 A1 | 6/2018 | Kim | |
| 2018/0309944 A1 | 10/2018 | Lee et al. | |

* cited by examiner

*Primary Examiner* — Shahbaz Nazrul
(74) *Attorney, Agent, or Firm* — Sughrue Mion, PLLC

(57) ABSTRACT

Provided is an image sensor including a pixel array including a plurality of auto focus (AF) pixels and a plurality of normal pixels, wherein each of the plurality of AF pixels comprises two sub-pixels, a light blocking member provided between the two sub-pixels, and a lens corresponding to the two sub-pixels, and wherein the light blocking member is shifted from an intermediate point of the two sub-pixels.

17 Claims, 22 Drawing Sheets

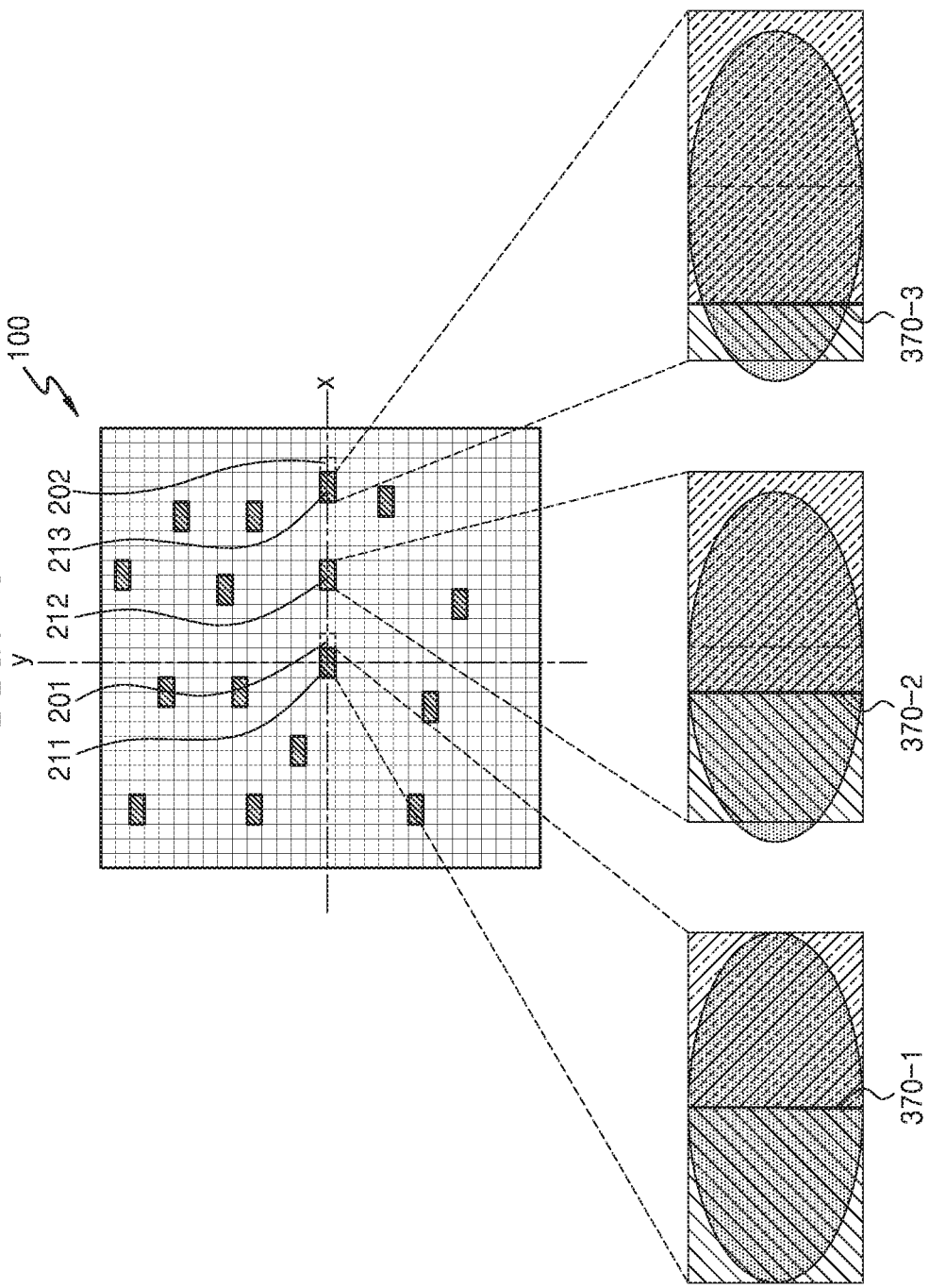

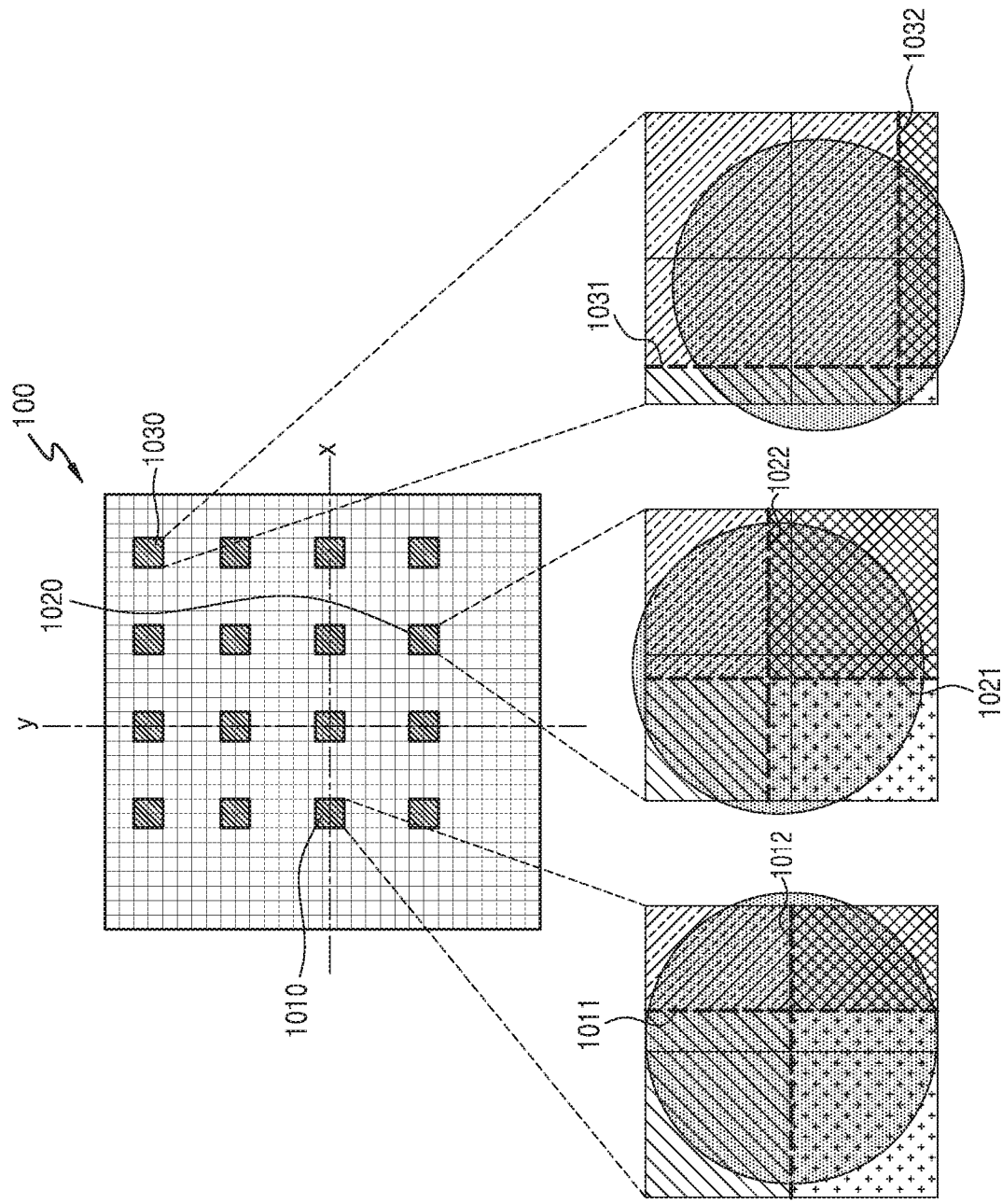

IMAGE SENSOR INCLUDING AUTO FOCUS PIXEL

CROSS-REFERENCE TO THE RELATED APPLICATION

This application claims priority to Korean Patent Application No. 10-2019-0068276, filed on Jun. 10, 2019, in the Korean Intellectual Property Office, the disclosure of which is incorporated herein in its entirety by reference.

BACKGROUND

1. Field

Example embodiments of the present disclosure relate to an image sensor, and more particularly, to an image sensor including an auto focus (AF) pixel including a light blocking member in a variable position and a method of operating the same.

2. Description of Related Art

An electronic apparatus having a function of capturing an image such as a digital camera or a smartphone may include an image sensor. The image sensor as a semiconductor device for converting optical information into an electrical signal may be a charge coupled device (CCD) image sensor or a complementary metal oxide semiconductor (CMOS) image sensor.

The image sensor includes a photoelectric transformation element and a plurality of pixels including a plurality of transistors. A signal on which photoelectric transformation is performed by the photoelectric transformation element is processed by the plurality of transistors, is output, and may generate image data based on a pixel signal output by a pixel. Each pixel may perform photoelectric transformation on light of a particular color or wavelength and may output a signal obtained by performing the photoelectric transformation.

The electronic apparatus having the function of capturing an image may have an AF function using the image sensor in order to control a focus. The electronic apparatus may perform AF by a contrast detecting method or a phase detecting method. In the phase detecting method, light incident on a pixel is divided into two or more and the divided light components are compared with each other and accordingly, it may be determined whether a focus is adjusted. The electronic apparatus may automatically focus in accordance with the determination result.

SUMMARY

One or more example embodiments provide an image sensor capable of improving auto focus (AF) performance without deteriorating the performance of a normal pixel.

According to an aspect of an example embodiment, there is provided an image sensor including a pixel array including a plurality of auto focus (AF) pixels and a plurality of normal pixels, wherein each of the plurality of AF pixels comprises two sub-pixels, a light blocking member provided between the two sub-pixels, and a lens corresponding to the two sub-pixels, and wherein the light blocking member is shifted from an intermediate point of the two sub-pixels.

According to another aspect of an example embodiment, there is provided an image sensor including a pixel array including a plurality of auto focus (AF) pixels and a plurality of normal pixels, wherein each of the plurality of AF pixels includes a first sub-pixel, a second sub-pixel, and a third sub-pixel provided sequentially, a first light blocking member provided between the first sub-pixel and the second sub-pixel, a second light blocking member provided between the second sub-pixel and the third sub-pixel, and a lens corresponding to the first sub-pixel, the second sub-pixel, and the third sub-pixel, and wherein the first light blocking member and the second light blocking member are respectively shifted from an intermediate point between the first sub-pixel and the second sub-pixel and an intermediate point between the second sub-pixel and the third sub-pixel.

According to another aspect of an example embodiment, there is provided an image sensor including a pixel array including a plurality of AF pixels and a plurality of normal pixels, wherein each of the plurality of AF pixels include a first light blocking member including a first sub-pixel, a second sub-pixel adjacent to the first sub-pixel in a horizontal direction, a third sub-pixel adjacent to the first sub-pixel in a vertical direction, a fourth sub-pixel simultaneously adjacent to the second sub-pixel in the vertical direction and the third sub-pixel in the horizontal direction, a first light blocking member dividing each of the plurality of AF pixels in a vertical direction, a second light blocking member dividing each of the plurality of AF pixels in a horizontal direction, and a lens corresponding to the first sub-pixel, the second sub-pixel, the third sub-pixel, and the fourth sub-pixel, and wherein the first light blocking member and the second light blocking member are respectively shifted from a horizontal intermediate point of each of the plurality of AF pixels and a vertical intermediate point of each of the plurality of AF pixels.

BRIEF DESCRIPTION OF THE DRAWINGS

The above and other aspects and features will be more clearly understood from the following detailed description taken in conjunction with the accompanying drawings in which:

FIG. 6 illustrates an example in which a position of a light blocking member changes in accordance with a position in a pixel array according to exemplary embodiments;

FIG. 10B illustrates another example in which a light blocking member of an AF pixel is shifted according to exemplary embodiments;

DETAILED DESCRIPTION

Figure 1:
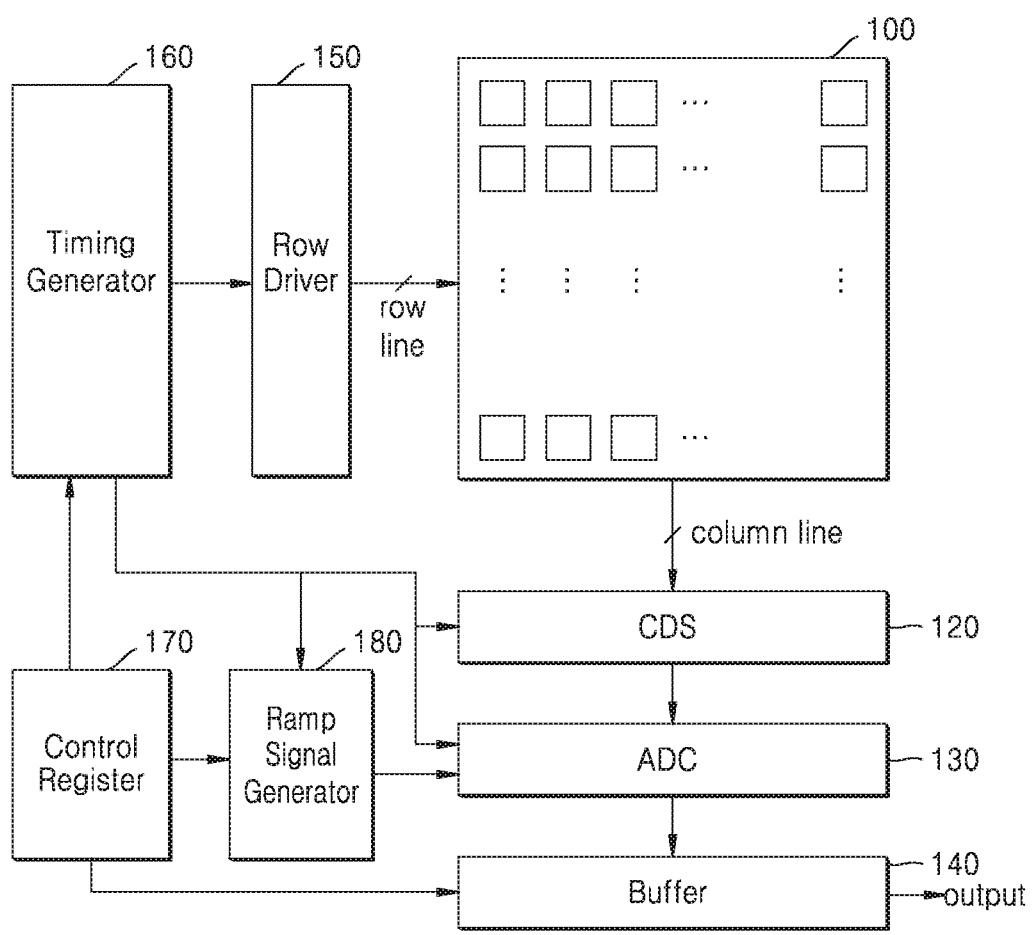
FIG. 1 is a block diagram of an image sensor according to exemplary embodiments.

FIG. 1 is a block diagram of an image sensor according to exemplary embodiments.

Referring to FIG. 1, the image sensor may include a pixel array 100 in which a plurality of pixels are arranged in a matrix, a correlated double sampling (CDS) 120, an analog-digital converter (ADC) 130, a buffer 140, a row driver 150, a timing generator 160, a control register 170, and a ramp signal generator 180.

The timing generator 160 may generate one or more control signals for controlling operations of the CDS 120, the ADC 130, the row driver 150, and the ramp signal generator 180. The control register 170 may generate one or more control signals for controlling operations of the buffer 140, the timing generator 160, and the ramp signal generator 180.

The row driver 150 may drive the pixel array 100 in units of row lines. For example, the row driver 150 may generate a selection signal for selecting one of a plurality of row lines. Each of the plurality of pixels may sense incident light and may output an image reset signal and an image signal to the CDS 120 through a column line. The CDS 120 may perform sampling on the received image reset signal and image signal.

The ADC 130 may compare a ramp signal output from the ramp signal generator 180 with a sampling signal output from the CDS 120 and may output a comparison signal. A level transition time of the comparison signal is counted in accordance with a clock signal provided from the timing generator 160 and a count value may be output to the buffer 140. The ramp signal generator 180 may operate in accordance with control of the timing generator 160.

The buffer 140 may store a plurality of digital signals output from the ADC 130, may sense and amplify the stored digital signals, and may output the sensed and amplified digital signals. Therefore, the buffer 140 may include a memory and a sensing amplifier. The memory may store the count value which is related to a signal output from the plurality of pixels. The sensing amplifier may sense and amplify the count value output from the memory.

Figure 2:
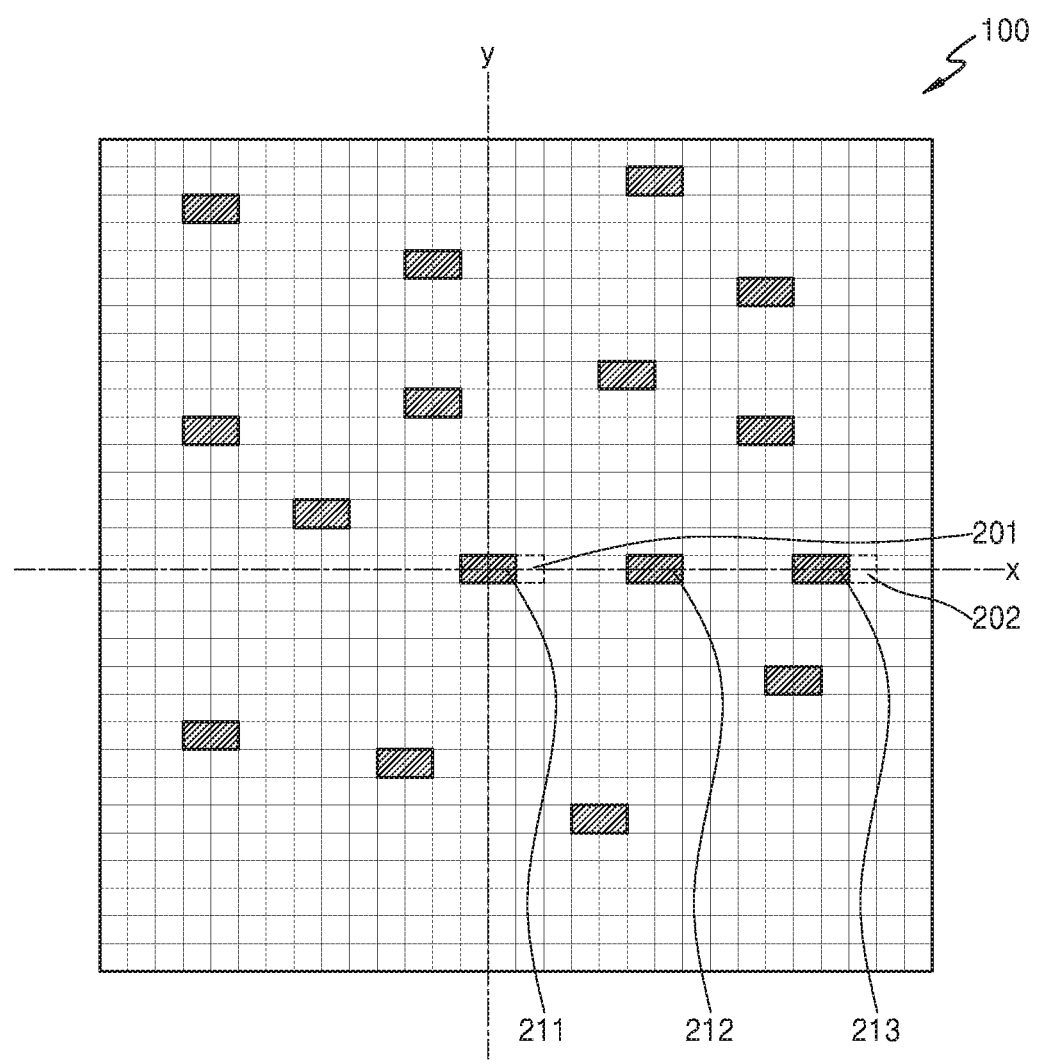
FIG. 2 illustrates a pixel array including a normal pixel and an auto focus (AF) pixel according to exemplary embodiments.

FIG. 2 illustrates the pixel array 100 including a normal pixel and an AF pixel according to exemplary embodiments.

Referring to FIG. 2, the pixel array 100 may include a plurality of normal pixels and a plurality of AF pixels.

According to example embodiments, the plurality of AF pixels may be arranged in an entire region of the pixel array 100. For example, the plurality of AF pixels may include a first AF pixel 211, a second AF pixel 212, and a third AF pixel 213. Referring to FIG. 2, the plurality of AF pixels are illustrated to be randomly arranged in the entire region of the pixel array 100. However, embodiments are not limited thereto. In an example embodiment, the plurality of AF pixels may be arranged at uniform intervals.

According to example embodiments, each of the plurality of AF pixels may include two adjacent sub-pixels. For example, one AF pixel may include two adjacent normal pixels. In the pixel array 100 that adopts a Bayer pattern, color filters of adjacent pixels may be different from each other. One AF pixel may be formed by arranging one color filter at upper ends of the two adjacent normal pixels.

Referring to FIG. 2, one AF pixel is illustrated as including two sub-pixels, that is, two normal pixels. However, embodiments are not limited thereto. According to example embodiments, one AF pixel may include three normal pixels arranged in a line or four normal pixels arranged to configure a square, which will be described later with reference to FIGS. 8 and 10.

Figure 3A:
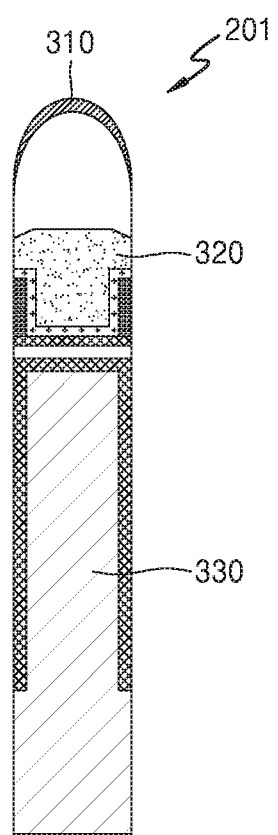
FIG. 3A is a structure chart of a normal pixel according to exemplary embodiments.

FIG. 3A is a structure diagram of a normal pixel 201 according to exemplary embodiments.

Referring to FIGS. 2 and 3A, the normal pixel 201 is illustrated. The normal pixel 201 according to exemplary embodiments may include a normal lens 310, a color filter 320, and a photoelectric transformation element 330.

The normal lens 310 may concentrate light refracted by a module lens and incident on the normal pixel 201. The light refracted by the module lens may be concentrated by the normal lens 310 and may be transmitted to the photoelectric transformation element 330. According to example embodiments, the normal lens 310 may be referred to as a micro-lens.

A color filter 320 may filter light of a particular wavelength among light components incident through the normal lens 310. For example, when the color filter 320 is a green filter, a wavelength of light that passes through the color filter 320 may be 495 nm to 570 nm. In another example, when the color filter 320 is a red filter, a wavelength of light that passes through the red filter may be 620 nm to 750 nm. In another example, when the color filter 320 is a blue filter, a wavelength of light that passes through the blue filter may be 450 nm to 495 nm. The color filter 320 may be arrayed in accordance with the Bayer pattern.

The photoelectric transformation element 330 may sense light and may generate the image signal. For example, the photoelectric transformation element 330 may generate electrons in accordance with detected light and may transform the generated electrons into an electrical signal based on an amount of the generated electrons. According to example embodiments, the photoelectric transformation element 330 may include at least one of a photodiode, a photo-gate, and a pinned photodiode.

Figure 3B:
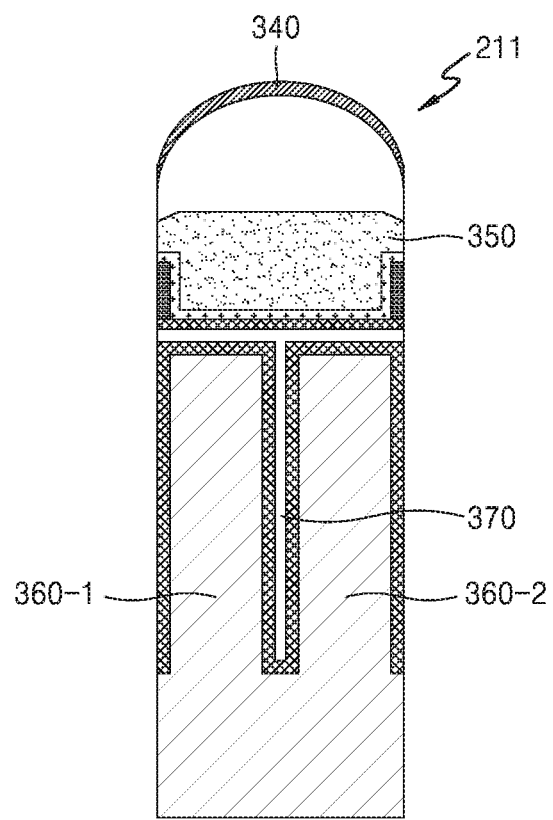
FIG. 3B illustrates a structure of an AF pixel according to exemplary embodiments.

FIG. 3B is a structure chart of an AF pixel 211 according to exemplary embodiments.

Referring to FIGS. 2 and 3B, the first AF pixel 211 is illustrated.

The first AF pixel 211 according to exemplary embodiments may include an AF lens 340, a color filter 350, first photoelectric transformation element 360-1 and a second photoelectric transformation element 360-2, and a light blocking member 370.

The AF lens 340 may concentrate light refracted by a module lens and incident on the first AF pixel 211. The concentrated light may be transmitted to the first photoelectric transformation element 360-1 and the second photoelectric transformation element 360-2. According to example embodiments, the AF lens 340 may be distinguished from the normal lens 310 of the normal pixel 201. For example, the normal lens 310 may cover a region corresponding to a single pixel, while the AF lens 340 may cover a region corresponding to two adjacent normal pixels. In another example, a curvature of the AF lens 340 may have a value less than that of a curvature of the normal lens 310. According to example embodiments, the AF lens 340 may be referred to as a dual lens or a dual micro-lens.

The color filter 350 may filter light of a particular wavelength among light components incident through the AF lens 340. Detailed description of the color filter 350 included in the first AF pixel 211 will be made with reference to description of the color filter 320 of FIG. 3A.

The first and second photoelectric transformation elements 360-1 and 360-2 may sense light and may generate the image signal. According to example embodiments, the first and second photoelectric transformation elements 360-1 and 360-2 of the first AF pixel 211 may include two or more photoelectric transformation elements 330 illustrated in FIG. 3A.

In an example embodiment, the first AF pixel 211 may include the first photoelectric transformation element 360-1 and the second photoelectric transformation element 360-2. That is, the first AF pixel 211 may include the first photoelectric transformation element 360-1 and the second photoelectric transformation element 360-2 that are adjacent to each other. The first photoelectric transformation element 360-1 and the second photoelectric transformation element 360-2 may be separated from each other by the light blocking member 370. The first photoelectric transformation element 360-1 and the second photoelectric transformation element 360-2 may detect phases of light components divided by the light blocking member 370.

The light blocking member 370 may electrically or physically divide adjacent photoelectric transformation elements, for example, the first photoelectric transformation element 360-1 and the second photoelectric transformation element 360-2 from each other. The light blocking member 370 may have a trench structure having a depth and width in a vertical direction. The light blocking member 370 may be filled with a material having a relatively low refractive index. For example, a refractive index of silicon (Si) is about 3.5 and the material filled in the light blocking member 370 such as an oxide may have a refractive index of about 1.4. Therefore, the incident light that passes through the module lens and the AF lens 340 is totally reflected by the light blocking member 370 in accordance with a difference in refractive index and may not be transmitted to an adjacent photoelectric transformation element.

The first photoelectric transformation element 360-1 and the second photoelectric transformation element 360-2 may generate an image by sensing light and transforming the sensed light into an electrical signal. Detailed description of the first photoelectric transformation element 360-1 and the second photoelectric transformation element 360-2 included in the first AF pixel 210 may be made with reference to description of the photoelectric transformation element 330 of FIG. 3A.

Figure 4A:
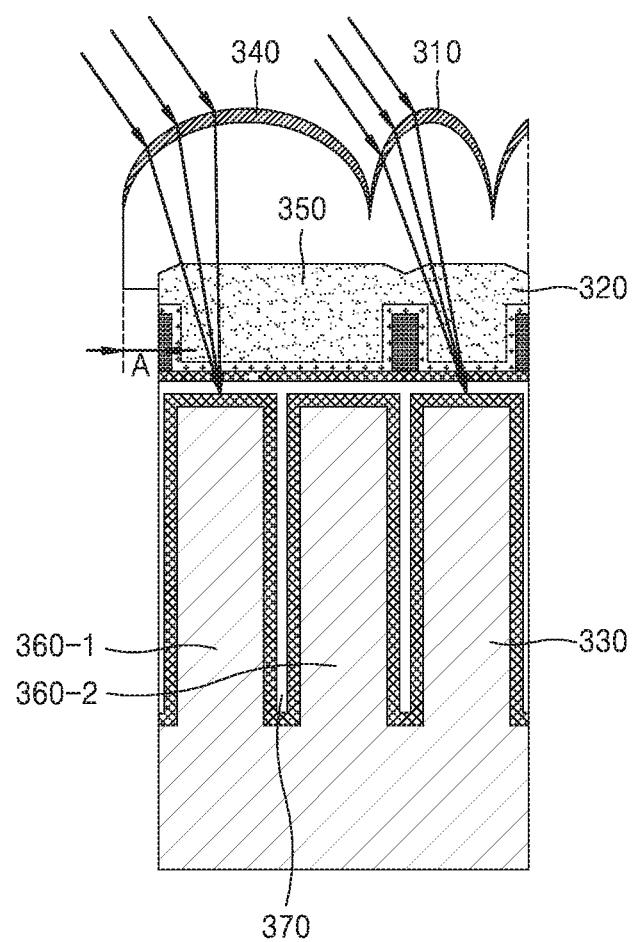
FIG. 4A illustrates an example of a path of light incident on a normal pixel and an AF pixel.

FIG. 4A illustrates an example of a path of light incident on a normal pixel and an AF pixel according to exemplary embodiments.

Referring to FIG. 4A, the normal lens 310 and the AF lens 340 may be horizontally shifted or shrunk with respect to the pixel array 100 arranged at lower ends thereof. In detail, the normal lens 310 and the AF lens 340 that are positioned at an edge of the pixel array 100 may be shifted or shrunk toward the center of the pixel array 100. For example, the AF lens 340 corresponds to a lens of the third AF pixel 213 of FIG. 2 and the normal lens 310 may correspond to a lens of a normal pixel 202. In this example, since the normal pixel 202 and the third AF pixel 213 are arranged on the right from the center of the pixel array 100, the normal lens 310 and the AF lens 340 may be shifted or shrunk to the left toward the center of the pixel array 100. The normal lens 310 and the AF lens 340 are shifted toward the center of the pixel array 100 and may receive light components having small chief ray angle (CRA) values among light components refracted by a module lens. The normal lens 310 and the AF lens 340 positioned at the edge of the pixel array 100 may optimize the amount of received light by receiving the light components having the small CRA values.

Figure 4B:
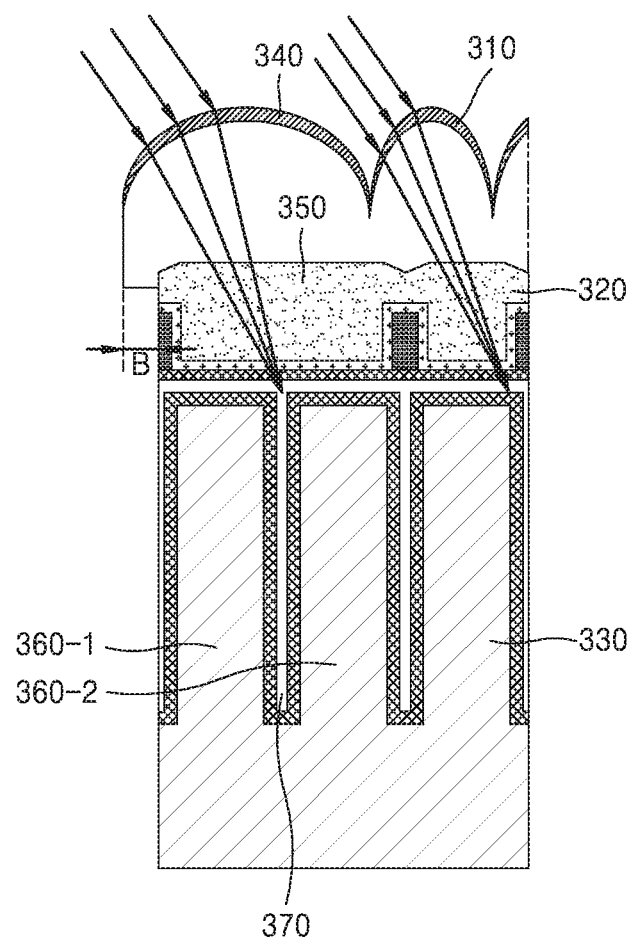
FIG. 4B illustrates another example of a path of light incident on a normal pixel and an AF pixel according to exemplary embodiments.

Light components incident on the normal lens 310 or the AF lens 340 of FIG. 4B are closer to a vertical line than the normal lens 310 or the AF lens 340 of FIG. 4A. That is, since positions of the color filters 320 and 350 and the photoelectric transformation element 330, the first photoelectric transformation element 360-1, and the second photoelectric transformation element 360-2 may not be shifted, the normal lens 310 and the AF lens 340 may be shifted to be close to the center of the pixel array 100 in a horizontal direction.

According to example embodiments, the normal lens 310 may receive light having three parallel paths. The light having the three paths may be incident on the photoelectric transformation element 330 through the color filter 320. Referring to FIG. 4A, the normal lens 310 receives the light having the three parallel paths and the light having the three paths is refracted and may concentrate on the photoelectric transformation element 330 of the normal pixel 202. In FIG. 4B, the normal lens 310 is shifted and accordingly, receives a large amount of light having a relatively small CRA and the light having the three paths may not concentrate on the photoelectric transformation element 330. It may be noted that the amount of received light may be optimized as the normal lens 310 is shifted.

According to example embodiments, the AF lens 340 may also receive the light having the three parallel paths. Since a lens array including both the normal lens 310 and the AF lens 340 is shifted, the AF lens 340 may also be shifted by a distance A. Although the CRA value of the light incident on the AF lens 340 is reduced, since the AF lens 340 is moved, a position in which the light concentrates may not match with a position of the light blocking member 370 of the first AF pixel. When the position in which the light concentrates does not match with the position of the light blocking member 370, photodetachment between the first photoelectric transformation element 360-1 and the second photoelectric transformation element 360-2 may be different from 1:1. Therefore, since phases detected by the photoelectric transformation elements of the first AF pixel are different, AF performance may deteriorate.

FIG. 4B illustrates another example of a path of light incident on a normal pixel and an AF pixel according to exemplary embodiments.

Referring to FIG. 4B, the normal lens 310 and the AF lens 340 may be horizontally shifted or shrunk with respect to the pixel array 100 arranged at the lower ends thereof. In detail, in order to reduce or prevent the AF performance from deteriorating in comparison with FIG. 4A, the normal lens 310 and the AF lens 340 may be additionally shifted or shrunk in a horizontal direction so that refracted light components concentrate on the position of the light blocking member 370 of the first AF pixel. For example, the normal lens 310 and the AF lens 340 may be shifted by a distance B with respect to the color filters 320 and 350 or the photoelectric transformation element 330, the first photoelectric transformation element 360-1, and the second photoelectric transformation element 360-2 arranged at the lower ends thereof. B may be less than A. Therefore, the light having the three paths refracted by the AF lens 340 may concentrate on the position of the light blocking member 370. When the AF lens 340 is shifted by the distance B and the light having the three paths concentrates on the position of the light blocking member 370, light components respectively received by the first photoelectric transformation element 360-1 and the second photoelectric transformation element 360-2 may be divided by 1:1. According to example embodiments, the normal lens 310 may also receive the light having the three parallel paths. Since the lens array including both the normal lens 310 and the AF lens 340 is shifted, the normal lens 310 may also be shifted by the distance B. Therefore, in the three paths of the light incident on the normal lens 310, one path may not reach the color filter 320 and the photoelectric transformation element 330. Therefore, the amount of received light of the normal pixel is reduced and image capturing performance and quality of the normal pixel may deteriorate.

Referring to FIGS. 4A and 4B, when the lens array is shifted in order to match the position of the light blocking member 370 of the first AF pixel with the position of the concentrated light, the amount of received light of the normal pixel is reduced and accordingly, the performance of the image sensor may deteriorate. In addition, when the lens array is shifted in order to optimize the amount of received light of the normal pixel, the position of the light blocking member 370 of the first AF pixel does not match with the position of the concentrated light and accordingly, AF performance may deteriorate Hereinafter, an example embodiment in which the position of the light blocking member 370 is set to be variable in order to simultaneously optimize the normal pixel and the first AF pixel will be described later with reference to FIG. 5A.

Figure 5A:
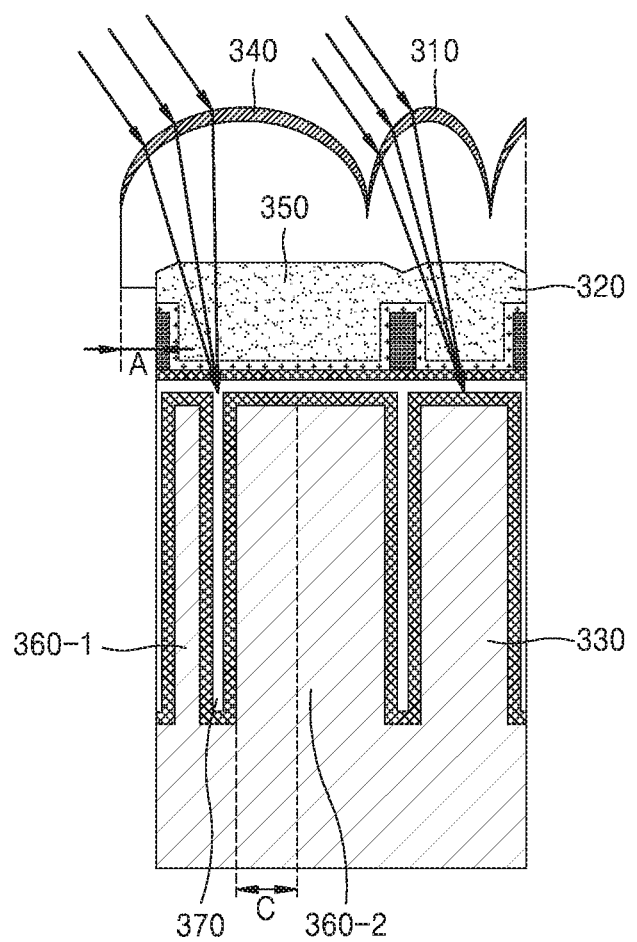
FIG. 5A illustrates an example in which a light blocking member of an AF pixel is shifted according to exemplary embodiments.
Figure 5B:
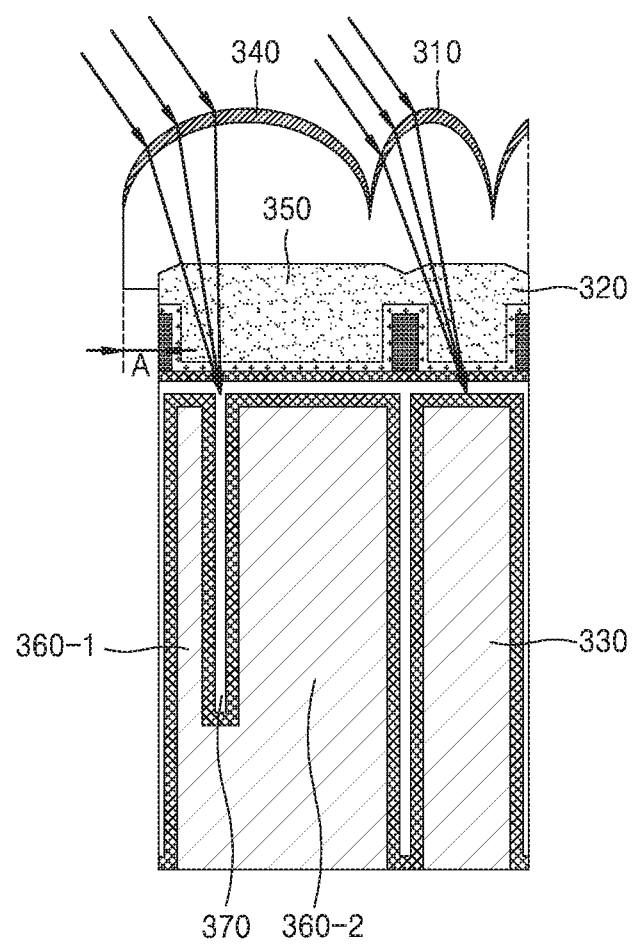
FIG. 5B illustrates an example in which an inter-pixel light blocking member is FDTI.
Figure 5C:
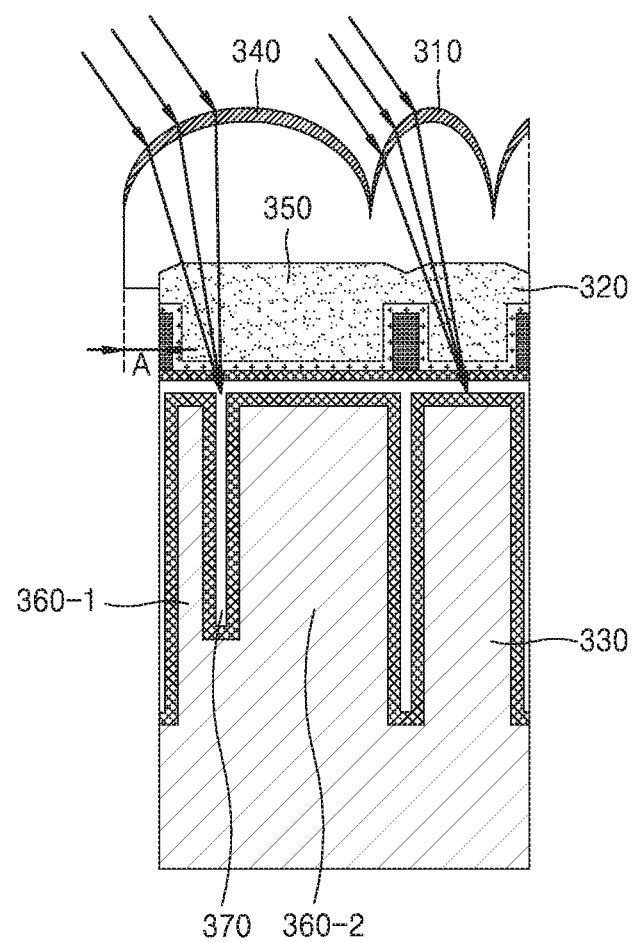
FIG. 5C is a plan view of an AF pixel in which a light blocking member is shifted.
Figure 5D:
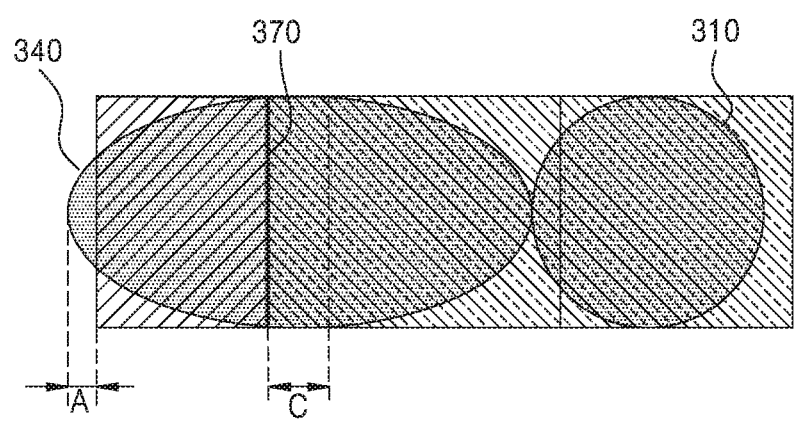
FIG. 5D is a plan view of an AF pixel in which a light blocking member is shifted.

FIG. 5A illustrates an example in which a light blocking member of an AF pixel is shifted according to exemplary embodiments, FIG. 5B illustrates an example in which an inter-pixel light blocking member has a full deep trench isolation (FDTI) structure, FIG. 5C illustrates another example in which a light blocking member of an AF pixel is shifted, and FIG. 5D is a plan view of an AF pixel in which a light blocking member is shifted.

Referring to FIG. 5A, the light blocking member in the variable position is illustrated. The first AF pixel according to exemplary embodiments may include the AF lens 340, the color filter 350, and the first photoelectric transformation element 360-1 and the second photoelectric transformation element 360-2.

According to example embodiments, the normal lens 310 and the AF lens 340 may be shifted in the horizontal direction. For example, a magnitude with which the lens array including the normal lens 310 and the AF lens 340 is shifted may correspond to a value for optimizing the amount of received light of the normal pixel. Referring to FIG. 4A, the normal lens 310 and the AF lens 340 are shifted by the distance A toward the center of the pixel array 100. Therefore, referring to FIG. 5A, the light refracted by the normal lens 310 is not reflected or lost and reaches the photoelectric transformation element 330 and accordingly, the amount of received light of the normal pixel 202 may be optimized.

According to example embodiments, the light blocking member 370 may be shifted by a distance C. For example, the light blocking member 370 may be shifted by the distance C toward the center of the pixel array 100. The position of the light blocking member 370, which is shifted, may be the same as the position on which the light refracted by the AF lens 340 concentrates.

According to example embodiments, the light concentrated by the AF lens 340 may reach the light blocking member 370 and may be divided by the first photoelectric transformation element 360-1 and the second photoelectric transformation element 360-2 included in the first AF pixel. A ratio of the light divided by the first photoelectric transformation element 360-1 and the second photoelectric transformation element 360-2 may correspond to 1:1. In the image sensor, phases of the light components divided by the light blocking member 370 in the ratio of 1:1 are respectively measured by the first photoelectric transformation element 360-1 and the second photoelectric transformation element 360-2. AF may be performed based on a difference between the phases detected by the first photoelectric transformation elements 360-1 and the second photoelectric transformation element 360-2.

Referring to FIG. 5A, it is illustrated that a vertical length of a light blocking member between a 2×1 AF pixel and adjacent pixels is equal to that of a light blocking member shifted in the 2×1 AF pixel. However, embodiments are not limited thereto. According to example embodiments, referring to FIG. 5B, the length of the light blocking member between the 2×1 AF pixel and the adjacent pixels, for example, normal pixels may have a greater value. For example, the light blocking member between the 2×1 AF pixel and the adjacent pixels may have a FDTI structure. Referring to FIGS. 5A and 5C, a length of the light blocking member 370 between sub-pixels may be equal to or less than that of a light blocking member between adjacent pixels. That is, in FIG. 5A, in a structure that is not the FDTI, the length of the light blocking member 370 between the sub-pixels is equal to that of the light blocking member between the adjacent pixels, for example, between a normal pixel and the first AF pixel or between a normal pixel and a normal pixel. However, embodiments are not limited thereto.

According to example embodiments, FIG. 5D is a plan view illustrating the normal pixel 202 and the third AF pixel 213. As described above, in order to increase the amount of received light of the normal pixel 202 and the third AF pixel 213 that are positioned at the edge of the pixel array 100, the lens array may be shifted.

Referring to FIG. 5D, it may be noted that the AF lens 340 and the normal lens 310 are shifted by a distance A to the left. In FIG. 5B, as an example for the normal pixel 202 and the third AF pixel 213 that are arranged at a right edge of the pixel array 100, the lens array is shifted to the left. However, embodiments are not limited thereto. For example, when the normal pixel and the first AF pixel are arranged at a left edge of the pixel array 100, the lens array including the normal lens and the AF lens may be shifted to the right.

Referring to FIG. 5D, the light blocking member 370 may be shifted by the distance C to the left. The light blocking member 370 is shifted by the distance C to the left and accordingly, the light components that pass through the AF lens 340 may be concentrated on the light blocking member 370. Therefore, in FIG. 5C, a segregation ratio between the first photoelectric transformation element 360-1 on the left and the second photoelectric transformation element 360-2 on the right may be 1:1. In FIG. 5D, for example, for the normal pixel 202 and the third AF pixel 213 that are arranged at the right edge of the pixel array 100, the light blocking member 370 may be shifted to the left. However, embodiments are not limited thereto.

According to the above-described example embodiments, the lens array including the normal lens 310 and the AF lens 340 and the light blocking member 370 of the first AF pixel may be simultaneously shifted. When the lens array is shifted by a distance A as illustrated in FIG. 4A and accordingly, the amount of received light of the normal pixel may be optimized. Simultaneously, the light blocking member 370 of the first AF pixel is may be shifted by the distance C as illustrated in FIG. 5A and accordingly, the light incident and concentrated on the first AF pixel may be divided by the first photoelectric transformation element 360-1 and the second photoelectric transformation element 360-2 in the same ratio. That is, by variably setting the position of the light blocking member 370, it is possible to prevent or reduce the performance of the normal pixel from deteriorating and to improve the AF performance.

FIG. 6 illustrates an example in which a position of a light blocking member changes in accordance with a position in a pixel array 100 according to exemplary embodiments.

Referring to FIG. 6, the pixel array 100 is illustrated. The pixel array 100 may include a plurality of AF pixels.

A first AF pixel 211 may be positioned in the center of the pixel array 100. Light that reaches the first AF pixel 211 may be incident in the vertical direction in which a CRA value is close to 0. Therefore, in the first AF pixel 211 positioned in the center of the pixel array 100, since a position of a light blocking member 370-1 matches with a position of concentrated light, the light blocking member 370-1 may not be shifted.

A second AF pixel 212 may be spaced apart to the right from the center compared to the first AF pixel 211. Light that reaches the second AF pixel 212 may have a CRA value greater than 0. That is, the light that reaches the second AF pixel 212 may be incident on the second AF pixel 212 in the vertical direction at a certain angle. Therefore, in the second AF pixel 212 spaced apart from the center of the pixel array 100, when a position of a light blocking member is not shifted, a position of the light blocking member may not match with a position of the light incident and concentrated on the second AF pixel 212. Therefore, in order to match the position of the concentrated light with the position of the light blocking member, the second AF pixel 212 may shift a light blocking member 370-2 in the horizontal direction. For example, when the second AF pixel 212 is positioned on the right side of the first AF pixel 211 in the pixel array 100, the light may be incident on the second AF pixel 212 to the left at a certain angle. Therefore, when a position of light concentrated on the first AF pixel 211 is the center of the first AF pixel 211, the position of the light concentrated on the second AF pixel 212 may be moved to the left from the center. Therefore, the light blocking member 370-2 of the second AF pixel 212 may be shifted to the left, that is, toward the center of the pixel array 100. The light blocking member 370-2 of the second AF pixel 212 may be shifted toward the center of the pixel array 100 and be matched with the position of the concentrated light. Accordingly, light detachment of 1:1 may be formed in the second AF pixel 212 based on the light blocking member 370-2.

A third AF pixel 213 may be positioned at the right edge of the pixel array 100. Light that reaches the third AF pixel 213 may have a greater CRA value than light that reaches the AF pixel 212. That is, the light that reaches the third AF pixel 213 may be incident on the third AF pixel 213 in the vertical direction at a great angle. In comparison with the second AF pixel 212, a position of light concentrated on the third AF pixel 213 may be shifted to the left from the position of the light concentrated on the second AF pixel 212. Therefore, in the third AF pixel 213, a light blocking member 370-3 may be shifted to the left, that is, toward the center of the pixel array 100. The light blocking member 370-3 of the third AF pixel 213 is shifted toward the center of the pixel array 100 and is matched with the position of the light concentrated on the third AF pixel 213. Accordingly, light detachment of 1:1 may be formed in the third AF pixel 213 based on the light blocking member 370-3.

A plurality of AF pixels positioned on the left side of the center of the pixel array 100 may also shift the light blocking member. That is, the plurality of AF pixels positioned on the left side of the center of the pixel array 100 may shift a light blocking member of each of the plurality of AF pixels to the right, that is, toward the center of the pixel array 100. Here, it is apparent that a magnitude with which the light blocking member is shifted increases away from the center of the pixel array 100.

Figure 7A:
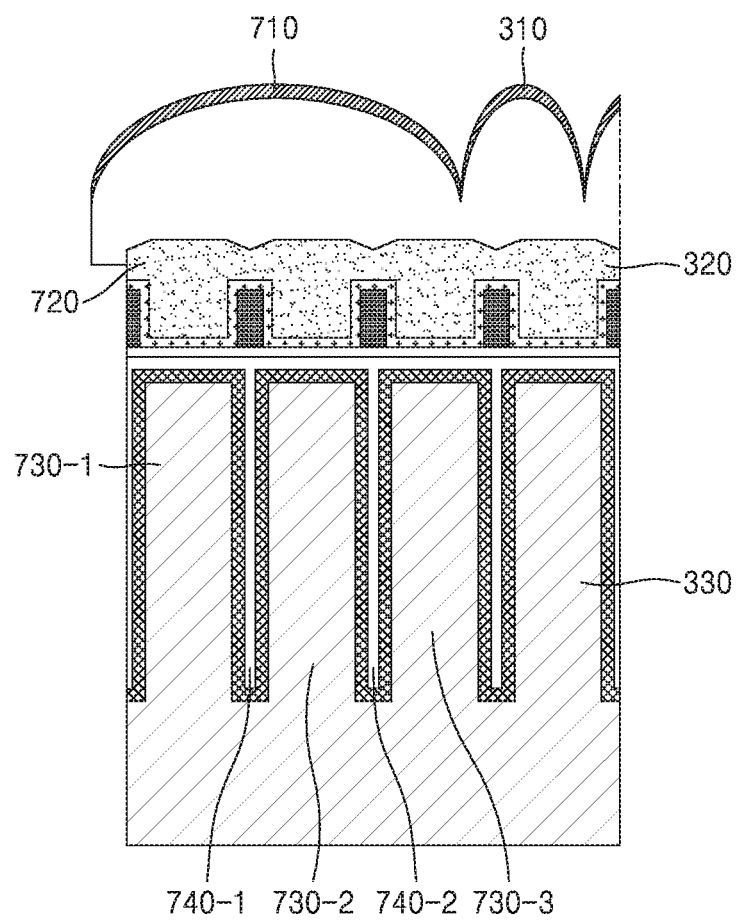
FIG. 7A illustrates a structure of another AF pixel according to exemplary embodiments.
Figure 7B:
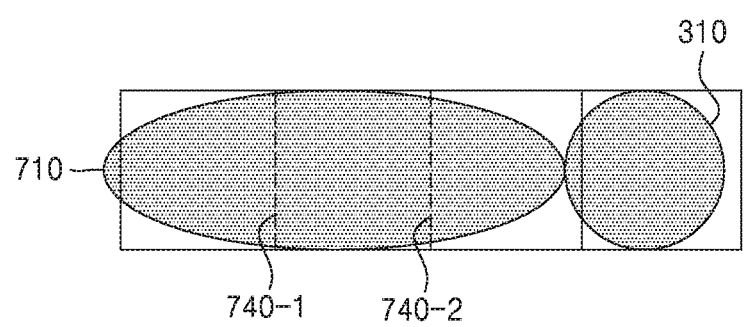
FIG. 7B is a plan view of another AF pixel.

FIG. 7A illustrates structure of an AF pixel according to exemplary embodiments, and FIG. 7B is a plan view of another AF pixel.

Referring to FIG. 7A, an AF pixel according to example embodiments is provided. The first AF pixel may include three sub-pixels. The three sub-pixels may refer to adjacent normal pixels arranged in a line. Hereinafter, the first AF pixel illustrated in FIG. 7A may be referred to as a 3×1 AF pixel.

An AF lens 710 of the 3×1 AF pixel may be distinguished from a lens of a normal pixel or a lens of the 2×1 AF pixel. The lens of the 3×1 AF pixel may cover sizes of the three adjacent normal pixels. In addition, a curvature of the lens of the 3×1 AF pixel may be less than curvatures of the lens of the normal pixel and the lens of the 2×1 AF pixel.

A color filter 720 of the 3×1 AF pixel may filter one of red, green, and blue colors. Detailed description of the color filter 720 may be referred to the description of the color filter of FIGS. 3A and 3B.

According to example embodiments, each of the first photoelectric transformation element 730-1, the second photoelectric transformation element 730-2, and the third photoelectric transformation element 730-3 may operate independently. For example, the first photoelectric transformation element 730-1, the second photoelectric transformation element 730-2, and the third photoelectric transformation element 730-3 may detect phases of light components concentrated thereon. Auto focusing may be performed based on a difference in value among the phases detected by the first photoelectric transformation element 730-1, the second photoelectric transformation element 730-2, and the third photoelectric transformation element 730-3.

The first light blocking member 740-1 and second light blocking member 740-2 of the 3×1 AF pixel may prevent or reduce crosstalk between adjacent photoelectric transformation elements. Detailed description of the first light blocking member 740-1 and the second light blocking member 740-2 may be referred to the description of the light blocking member of FIG. 3B.

Referring to FIG. 7B, the 3×1 AF pixel and the normal pixel may be adjacent to each other. Assuming that the 3×1 AF pixel and the normal pixel are arranged at the right edge of the pixel array 100, the lens array including the AF lens 710 of the 3×1 AF pixel and the normal lens 310 of the normal pixel may be shifted to the left based on the first photoelectric transformation element 730-1, the second photoelectric transformation element 730-2, and the third photoelectric transformation element 730-3 and the photoelectric transformation element 330 at a lower end thereof. The lens array is shifted toward the center of the pixel array, for example, to the left with reference to FIG. 7B, and accordingly, more light refracted by a module lens may be received by the pixel array.

Figure 8A:
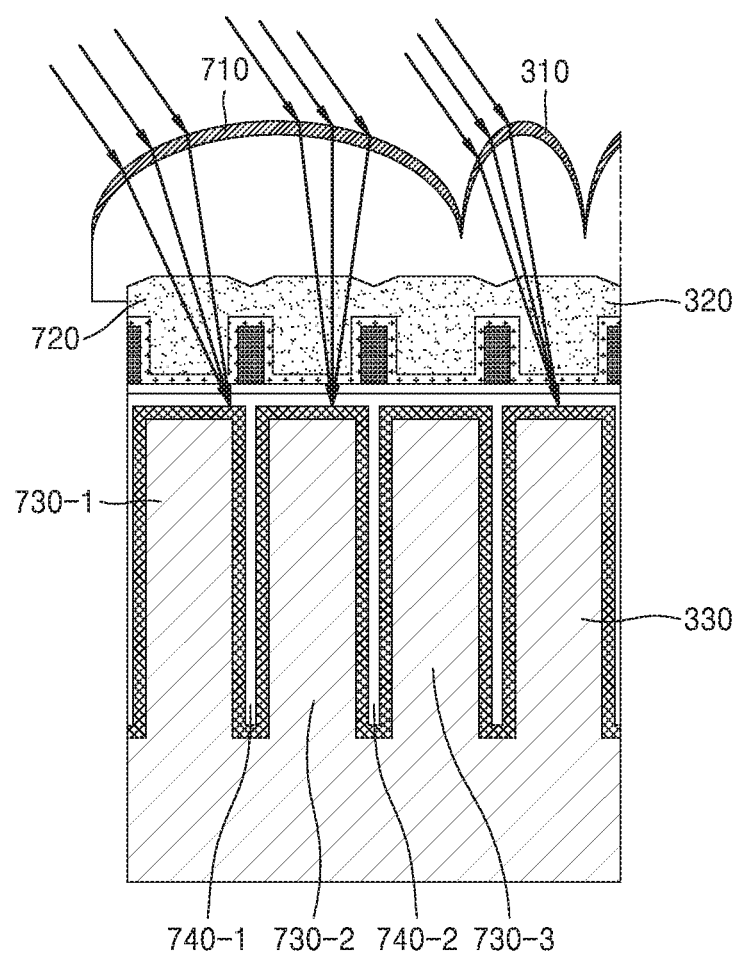
FIG. 8A illustrates an example of a path of light incident on another AF pixel according to exemplary embodiments.

FIG. 8A illustrates an example in which light blocking members of another AF pixel are shifted according to exemplary embodiments.

Referring to FIG. 8A, the 3×1 AF pixel may include three adjacent sub-pixels. Therefore, the 3×1 AF pixel may include the first light blocking member 740-1 positioned between the first photoelectric transformation element 730-1 and the second photoelectric transformation element 730-2 and the second light blocking member 740-2 positioned between the second photoelectric transformation element 730-2 and the third photoelectric transformation element 730-3.

According to example embodiments, when light having a CRA value that is not 0 is incident, a state before the first light blocking member 740-1 and the second light blocking member 740-2 are shifted is as follows. Since the light having the CRA value that is not 0 is incident on the AF lens 710 at a certain angle, a position on which the incident light concentrates may not match with positions of the first light blocking member 740-1 and the second light blocking member 740-2. Referring to FIG. 8A, the light refracted through the AF lens 710 of the 3×1 AF pixel is concentrated on the first photoelectric transformation element 730-1 and the second photoelectric transformation element 730-2, and is not concentrated on the third photoelectric transformation element 730-3. In this case, since light detachment is not equally formed at a ratio of 1:1:1 among the first photoelectric transformation element 730-1, the second photoelectric transformation element 730-2, and the third photoelectric transformation element 730-3, when the AF is performed, a process of adding phase offset is performed and accordingly, the AF performance may deteriorate.

Figure 8B:
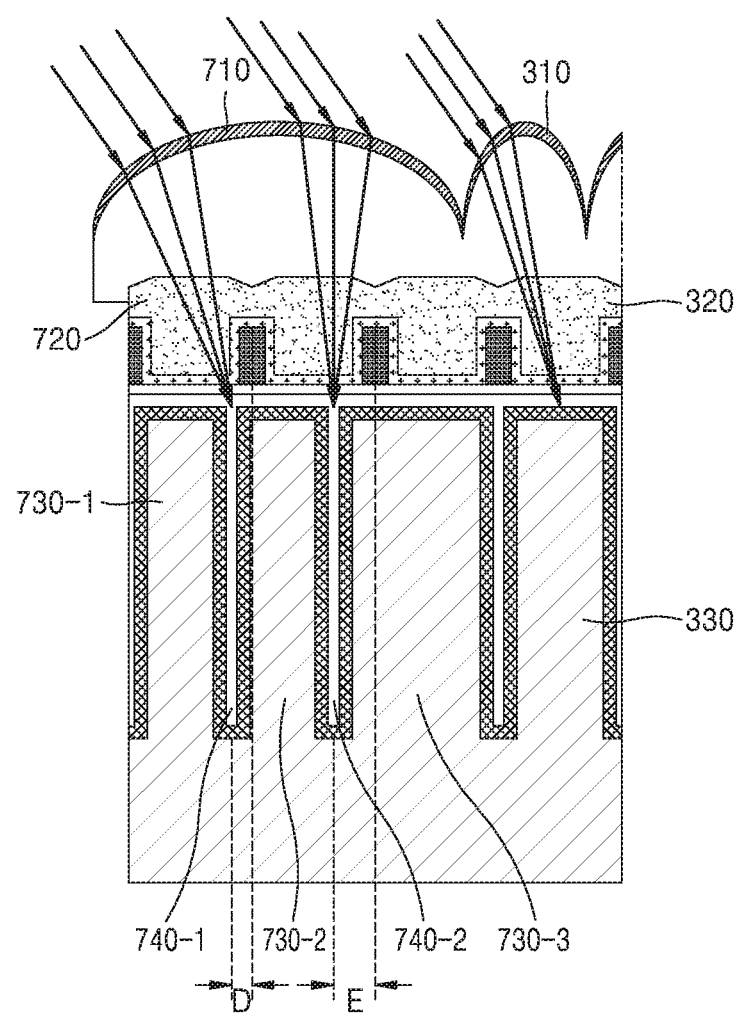
FIG. 8B illustrates an example in which light blocking members of another AF pixel are shifted.

According to example embodiments, the first light blocking member 740-1 and the second light blocking member 740-2 may be shifted. Between the first light blocking member 740-1 and the second light blocking member 740-2, the light blocking member remote from the center of the pixel array 100 may be shifted more than the other light blocking member. Referring to FIG. 8B, the first light blocking member 740-1 may be shifted to the left by a distance D and the second light blocking member 740-2 may be shifted to the left by a distance E. A magnitude of D may be less than that of E. In order to obtain the same segregation ratio among the first photoelectric transformation element 730-1, the second photoelectric transformation element 730-2, and the third photoelectric transformation element 730-3, the second light blocking member 740-2 may be shifted more than the first light blocking member 740-1. That is, the first AF pixel positioned at the edge of the pixel array 100 includes a plurality light blocking members, among the plurality of light blocking members, the light blocking member remote from the center of the pixel array 100 may be shifted more toward the center of the pixel array 100.

According to example embodiments, incident light may be equally divided between the first light blocking member 740-1 and the second light blocking member 740-2, which are shifted. Referring to FIG. 8B, a ratio among light incident on the first photoelectric transformation element 730-1 between the first light blocking member 740-1, which is shifted, and a pixel adjacent to the first light blocking member 740-1 on the left, light incident on the second photoelectric transformation element 730-2 between the first light blocking member 740-1, which is shifted, and the second light blocking member 740-2, which is shifted, and light incident on a region between the second light blocking member 740-2 and a normal pixel adjacent to the second light blocking member 740-2 on the right may be uniform. Therefore, by omitting the process of adding the phase offset for performing auto focusing, auto focusing is performed at a high speed and accordingly, the performance of auto focusing may improve.

Figure 8C:
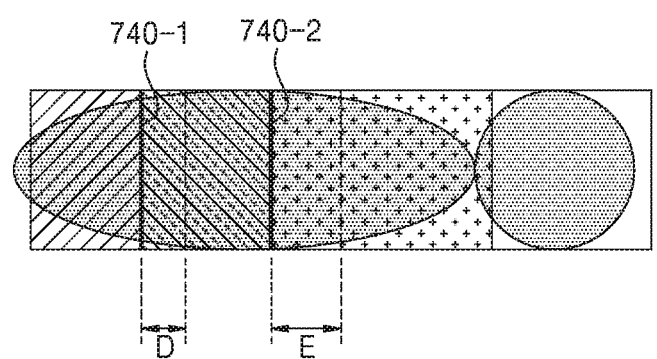
FIG. 8C is a plan view of another AF pixel.

FIG. 8C is a plan view illustrating an AF pixel in which a light blocking member is shifted and a normal pixel adjacent to the first AF pixel seen from above. It may be assumed that the 3×1 AF pixel and the normal pixel are arranged on the right from the center of the pixel array 100. As described above, the first light blocking member 740-1 may be shifted to the left by the distance D and the second light blocking member 740-2 may be shifted to the left by the distance E. Since the center of the pixel array 100 is positioned on the left based on the 3×1 AF pixel and the normal pixel, the second light blocking member 740-2 remote from the center of the pixel array 100 may be shifted more to the left. That is, the magnitude of E may be greater than that of D. Referring to FIG. 8C, the first photoelectric transformation element 730-1 may correspond to a region, a left region marked with oblique lines, from a light blocking member for dividing the 3×1 AF pixel from a normal pixel adjacent to the 3×1 AF pixel on the left to the first light blocking member 740-1, the second photoelectric transformation element 730-2 may correspond to a region, a right region marked with oblique lines, from the first light blocking member 740-1 to the second light blocking member 740-2, and the third photoelectric transformation element 730-3 may correspond to a region, a region marked with cross patterns, from the second light blocking member 740-2 to a light blocking member for dividing the 3×1 AF pixel from a normal pixel adjacent to the 3×1 AF pixel on the right. That is, the light blocking members are shifted and accordingly, the regions corresponding to the first photoelectric transformation element 730-1, the second photoelectric transformation element 730-2, and the third photoelectric transformation element 730-3 may have a segregation ratio of 1:1:1.

Figure 9:
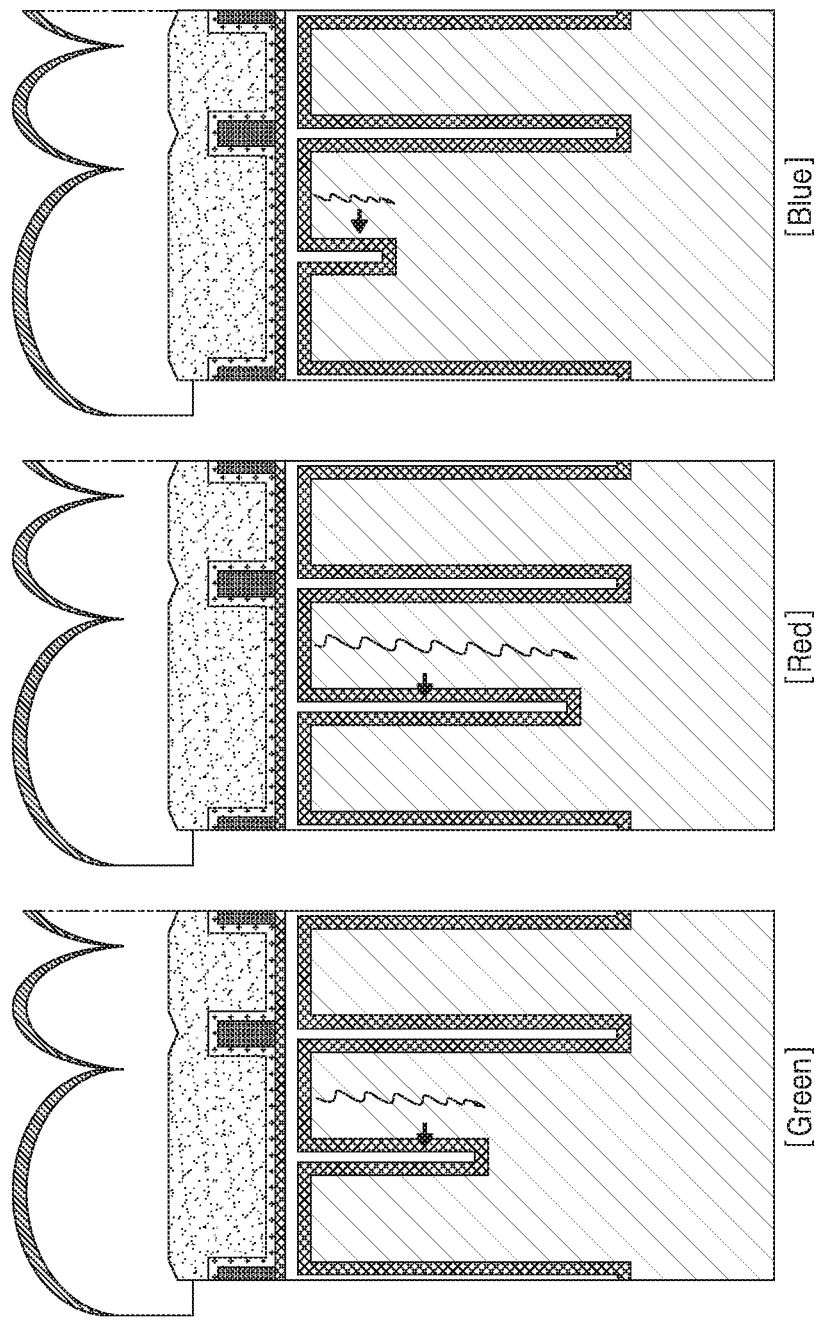
FIG. 9 illustrates an example of a change in vertical length of a light blocking member according to exemplary embodiments.

FIG. 9 illustrates an example of a change in vertical length of a light blocking member according to exemplary embodiments.

Referring to FIG. 9, the light blocking member of the first AF pixel may have a variable vertical length. For example, the light blocking member may have the variable vertical length based on a type of a color filter of the first AF pixel. In general, the permeability of a wavelength may be inversely proportional to a frequency of the wavelength. That is, since energy loss rapidly occurs in light at a high frequency as the light passes through a medium, a vertical depth with which the light may pass through the medium may be small. In addition, since energy loss slowly occurs in light at a low frequency as the light passes through a medium, a vertical depth with which the light may pass through the medium may be large.

According to example embodiments, the color filter of the first AF pixel may be a green color filter. A green wavelength of light that passes through the color filter and reaches the photoelectric transformation elements may be 495 nm to 570 nm. In this case, the light blocking member may have a first length with which green is attenuated.

According to example embodiments, the color filter of the first AF pixel may be a red color filter. A red wavelength of light that passes through the color filter and reaches the photoelectric transformation elements may be 620 nm to 750 nm. The red wavelength may pass through the medium more deeply than the green wavelength. Therefore, the light blocking member may have a second length with which red is attenuated and that has a value greater than the first length.

According to example embodiments, the color filter of the first AF pixel may be a blue color filter. A blue wavelength of light that passes through the color filter and reaches the photoelectric transformation elements may be 450 nm to 495 nm. Since the blue wavelength is attenuated more rapidly than the green wavelength, the blue wavelength may not pass through the medium more deeply. Therefore, the light blocking member may have a third length with which blue is attenuated and that has a value less than the first length.

According to the above-described example embodiments, the light blocking member may be variably arranged in the horizontal direction based on the position of the first AF pixel, for example, the CRA value of the light incident on the first AF pixel and may have a variable depth in the vertical direction based on the type of the color filter.

Figure 10A:
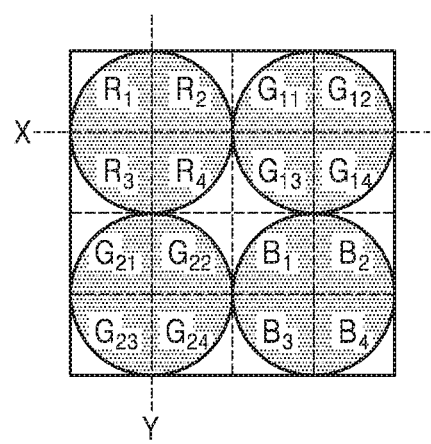
FIG. 10A illustrates an example of an AF pixel based on a quad Bayer pattern according to exemplary embodiments.

FIG. 10A illustrates an example of an AF pixel based on a quad Bayer pattern according to exemplary embodiments.

Referring to FIG. 10A, a pixel array of the quad Bayer pattern is illustrated. According to example embodiments, the pixel array of a Bayer pattern may include an R pixel, a Ga pixel, a Gb pixel, and a B pixel. In the pixel array of the quad Bayer pattern, each of the pixels of the quad Bayer pattern may be divided into four pixels. For example, the R pixel of the Bayer pattern may be divided into four pixels R1, R2, R3, and R4.

According to example embodiments, in the quad Bayer pattern, the first AF pixel may include two or more subpixels. For example, in the Bayer pattern, the first AF pixel may include the R pixel and a G1 pixel adjacent to the R pixel. Similarly, the quad Bayer pattern may include the R1 pixel and the R2 pixel. In this case, unlike in the Bayer pattern, since it is not necessary to change a color filter of the R pixel into a green color filter, a post-processing process of interpolation may be omitted. In another example, the first AF pixel may include four sub-pixels. In the quad Bayer pattern, the first AF pixel may include four sub-pixels by arranging one red color filter on an $R_1$ pixel, an $R_2$ pixel, an $R_3$ pixel, and an $R_4$ pixel. The first AF pixel may include four sub-pixels by arranging one green color filter on a $G_{11}$ pixel, a $G_{12}$ pixel, a $G_{13}$ pixel, and a $G_{14}$ pixel, or a $G_{21}$ pixel, a $G_{22}$ pixel, a $G_{23}$ pixel, and a $G_{24}$ pixel. In the quad Bayer pattern, the first AF pixel may include four sub-pixels by arranging one blue color filter on a $B_1$ pixel, a $B_2$ pixel, a $B_3$ pixel, and a $B_4$ pixel. The first AF pixel including the four sub-pixels may be referred to as a 2×2 AF pixel.

FIG. 10B illustrates another example in which a light blocking member of an AF pixel is shifted according to exemplary embodiments.

Referring to FIG. 10B, the pixel array 100 including a plurality of 2×2 AF pixels is provided. A first 2×2 AF pixel 1010 may be arranged on the left from the center of the pixel array 100, a second 2×2 AF pixel 1020 may be arranged at a right lower end from the center of the pixel array 100, and a third 2×2 AF pixel 1030 may be arranged at a right upper end from the center of the pixel array 100.

Each of the plurality of 2×2 AF pixels may include two light blocking members. First light blocking members 1011, 1021, and 1031 in each of the AF pixels 1010, 1020, and 1030 may run parallel with a y axis in order to divide the first AF pixel into a left region and a right region, and second light blocking members 1012, 1022, and 1032 in each of the AF pixels 1010, 1020, and 1030 may run parallel with an x axis in order to divide the first AF pixel into an upper region and a lower region. Two light blocking members may intersect with each other and four regions may be distinguished from each other based on the two light blocking members. The four regions may correspond to first to fourth photoelectric transformation elements. For example, the first 2×2 AF pixel 1010 may include the first light blocking member 1011 and the second light blocking member 1012. Since the first light blocking member 1011 and the second light blocking member 1012 intersect with each other, the first 2×2 AF pixel 1010 may be divided into four regions. Assuming that the first 2×2 AF pixel 1010 is arranged at a lower end of a red color filter, based on an intersection point of the light blocking member, a left upper end region may correspond to the R1 pixel of FIG. 10A, a right upper end region may correspond to the R2 pixel of FIG. 10A, a left lower end region may correspond to the R3 pixel of FIG. 10A, and a right lower end region may correspond to the R4 pixel of FIG. 10A.

According to example embodiments, the first light blocking members 1011, 1021, and 1031 and the second light blocking members 1012, 1022, and 1032 may be determined based on the position of the 2×2 AF pixel. For example, the first light blocking members 1011, 1021, and 1031 may be determined based on an x axis distance between the center of the 2×2 AF pixel and the center of the pixel array 100. In another example, the second light blocking members 1012, 1022, and 1032 may be determined based on a y axis distance between the center of the 2×2 AF pixel and the center of the pixel array 100.

In the first 2×2 AF pixel 1010, only the first light blocking member 1011 may be shifted to the right. For example, assuming that the center of the pixel array 100 is (0,0), the center point of the first 2×2 AF pixel 1010 may be positioned on (10,0). In this case, the first 2×2 AF pixel 1010 may be moved from the center of the pixel array 100 in an x axis direction and not in a y axis direction. Therefore, among the light blocking members of the first 2×2 AF pixel 1010, only the first light blocking member 1011 may be shifted to the right and the second light blocking member 1012 may not be shifted. Therefore, a segregation ratio among the first to fourth photoelectric transformation elements of the first 2×2 AF pixel 1010 may be uniform.

In the second 2×2 AF pixel 1020, the first light blocking member 1021 is shifted to the left and the second light blocking member 1022 may be shifted to an upper end. For example, assuming that the center of the pixel array 100 is (0,0), the center point of the second 2×2 AF pixel 1020 may be positioned on (−10,10). In this case, since the second 2×2 AF pixel 1020 is moved from the center of the pixel array 100 in x axis and y axis directions, among the light blocking members of the second 2×2 AF pixel 1020, the first light blocking member 1021 may be shifted to the left and the second light blocking member 1022 may be shifted to an upper end. That is, an intersection point of the light blocking members of the second 2×2 AF pixel 1020 may face the center of the pixel array 100. Therefore, a segregation ratio among the first to fourth photoelectric transformation elements of the second 2×2 AF pixel 1020 may be uniform.

Similar to the second 2×2 AF pixel 1020, in the third 2×2 AF pixel 1030, both the first light blocking member 1031 and the second light blocking member 1032 may be shifted.

For example, assuming that the center of the pixel array 100 is (0,0), the center point of the third 2×2 AF pixel 1030 may be positioned on (−20,−20). The first light blocking member 1031 of the third 2×2 AF pixel 1030 may be shifted to the left and the second light blocking member 1032 of the third 2×2 AF pixel 1030 may be shifted to a lower end. A distance by which the third 2×2 AF pixel 1030 is spaced apart from the center of the pixel array 100 in the x axis and y axis directions is greater than that by which the second 2×2 AF pixel 1020 is spaced apart from the center of the pixel array 100 in the x axis and y axis directions. Therefore, a magnitude with which the first light blocking member 1031 is shifted in an x axis direction may be greater than that with which the first light blocking member 1021 is shifted in the x axis direction and a magnitude with which the second light blocking member 1032 is shifted in a y axis direction may be greater than that with which the second light blocking member 1022 is shifted in the y axis direction. That is, an intersection point in which the light blocking members of the third 2×2 AF pixel 1030 intersect with each other may face the center of the pixel array 100.

According to the above-described example embodiments, in the 2×2 AF pixel, the light blocking members are shifted in accordance with the position in which the 2×2 AF pixel is arranged in the entire pixel array region and accordingly, even in the 2×2 AF pixel arranged at the edge of the pixel array, a segregation ratio among the four sub-pixels may be uniform.

Referring to FIG. 10B, it is illustrated that the plurality of 2×2 AF pixels are uniformly distributed over the entire region of the pixel array 100 and a plurality of normal pixels are arranged in the remaining regions. However, embodiments are not limited thereto. For example, the pixel array 100 may be configured only by the 2×2 AF pixel without the normal pixel.

Figure 10C:
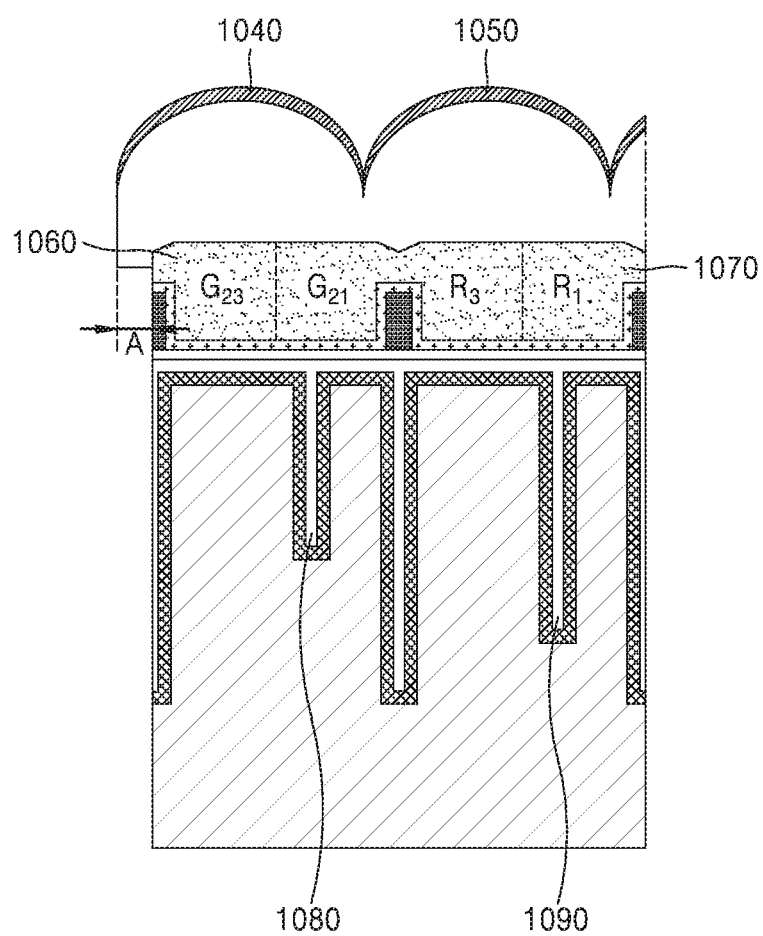
FIG. 10C illustrates a structure of an AF pixel of a quad Bayer pattern according to exemplary embodiments.

FIG. 10C illustrates a structure of an AF pixel of a quad Bayer pattern according to exemplary embodiments.

Referring to FIGS. 10A and 10C, structures of 2×1 AF pixels may be adjacent to each other. For example, in the cross-section taken along the y axis of FIG. 10A, a first AF lens 1040 and a second AF lens 1050 may be adjacent to each other. Referring to FIG. 10C, a color filter 1060 arranged at a lower end of the first AF lens 1040 may be a green color filter and a color filter 1070 arranged at a lower end of the second AF lens 1050 may be a red color filter. For example, the green color filter may include the $G_{21}$ and $G_{23}$ sub-pixels of FIG. 10A and the red color filter may include the $R_1$ and $R_3$ sub-pixels of FIG. 10A.

According to example embodiments, as illustrated in FIG. 9, a length of a light blocking member 1080 may be different from that of a light blocking member 1090 because a length in which the light that passes through the color filter is attenuated may vary in accordance with a color of light. For example, the length of the light blocking member 1090 may be greater than that of the light blocking member 1080. Here, although the length of the light blocking member 1090 is greatest among lengths of light blocking members corresponding to RGB color filters, the length of the light blocking member 1090 may be less than or equal to a length of a light blocking member between the first AF lens 1040 and the second AF lens 1050. According to the above-described example embodiments, the structure of the cross-section taken along the y axis is illustrated. However, embodiment are not limited thereto. For example, in the cross-section taken along the x axis of FIG. 10A, a first color filter 1060 and a second color filter 1070 may be arranged from the left in the order to $R_1$, $R_2$, $G_{11}$, and $G_{12}$.

Figure 11A:
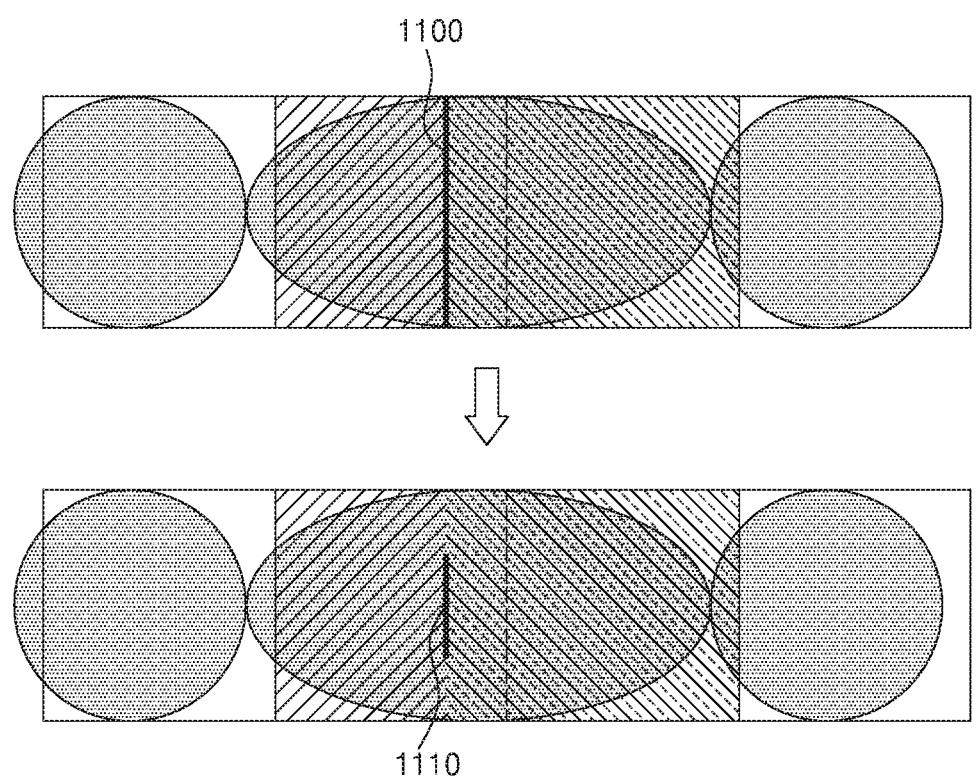
FIG. 11A illustrates a light blocking member having a changed shape of a 2×1 AF pixel according to exemplary embodiments.
Figure 11B:
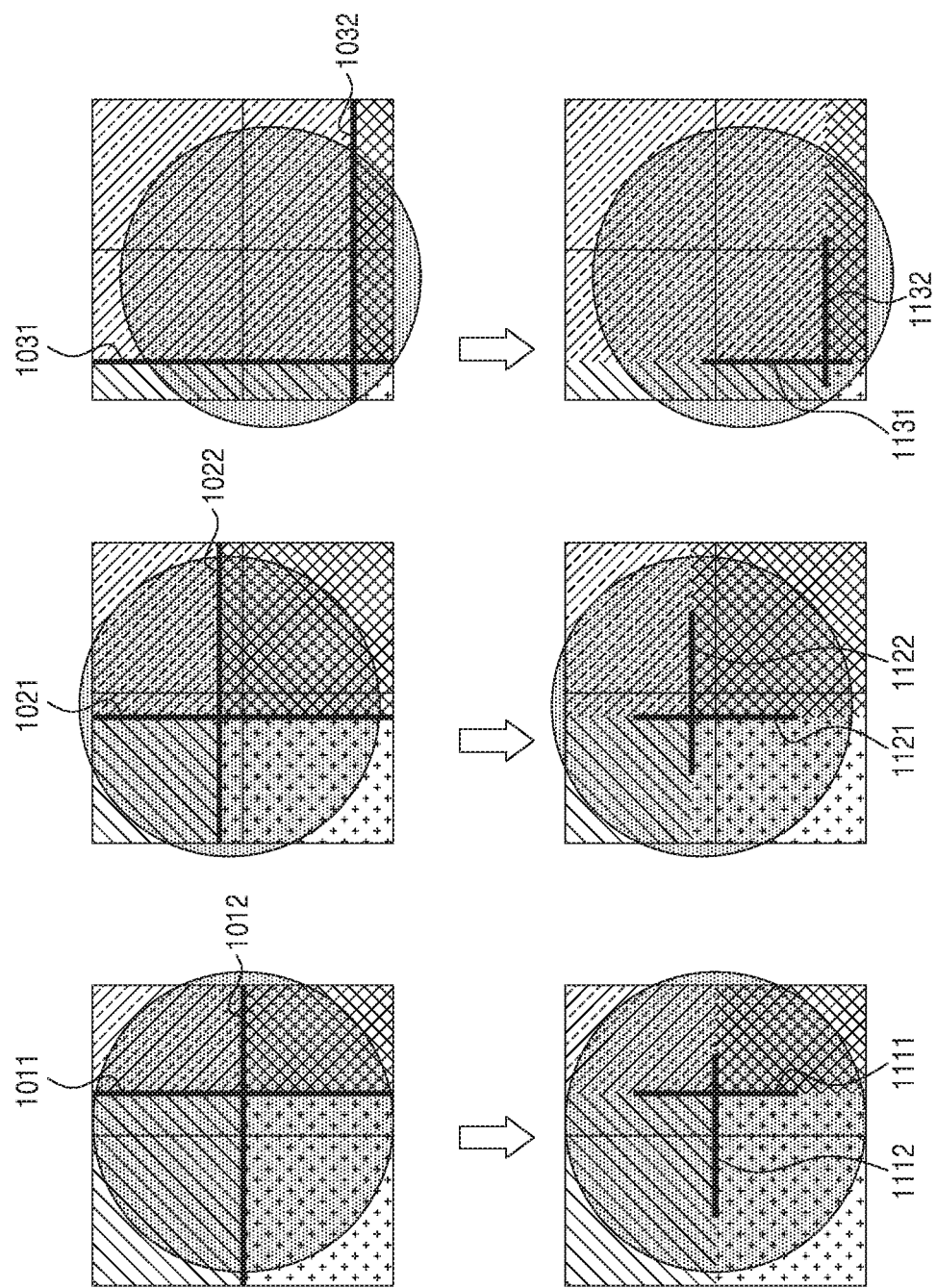
FIG. 11B illustrates a light blocking member having a changed shape of a 2×2 AF pixel according to exemplary embodiments.

FIG. 11A illustrates a light blocking member having a changed shape of a 2×1 AF pixel according to exemplary embodiments, and FIG. 11B illustrates a light blocking member having a changed shape of a 2×2 AF pixel according to exemplary embodiments.

Referring to FIG. 11A, the light blocking member of the 2×1 AF pixel is provided. The light blocking member may correspond to the bold line. Referring to FIGS. 5B and 11A, the 2×1 AF pixel and the light blocking member that are displayed at an upper end may correspond to the light blocking member 370 of FIG. 5B That is, the light blocking member 370 may have a length in a y axis direction large enough to completely divide a region corresponding to two sub-pixels into two regions.

According to example embodiments, a light blocking member 1110 may correspond to a light blocking member having a smaller length in the y axis direction than the region of photoelectric transformation elements. That is, the light blocking member 1110 may not completely divide a region of a first photoelectric transformation element from a region of a second photoelectric transformation element. For example, the light blocking member 1110 may not be physically connected to a light blocking member between pixels adjacent upward the 2×1 AF pixel and a light blocking member between pixels adjacent downward the 2×1 AF pixel. Although the light blocking member 1110 is used, since light that passes through a module lens and a lens of the 2×1 AF pixel concentrates on an intermediate point of the light blocking member 1110, the segregation ratio may not change even though the light blocking member does not completely divide a region of a first photoelectric transformation element from a region of a second photoelectric transformation element. In addition, in order to completely divide the region of the first photoelectric transformation element from the region of the second photoelectric transformation element, when the light blocking member 370 is formed, the light blocking member 370 may be formed together with a light blocking member, for example, a barrier between adjacent pixels, between pixels adjacent to the 2×1 AF pixel in manufacturing processes. The light blocking member 1110 having a smaller length in the y axis direction may be generated by etching the barrier between the pixels adjacent to the 2×1 AF pixel in a subordinated process without simultaneously generating the barrier between the pixels adjacent to the 2×1 AF pixel and the light blocking member 1110 while previously etching the barrier between the pixels adjacent to the 2×1 AF pixel.

Referring to FIG. 11B, light blocking members of the 2×2 AF pixel are provided. The light blocking members of the 2×2 AF pixel may correspond to thick lines. Referring to FIGS. 10B and 11B, the 2×2 AF pixel and the light blocking members that are displayed at an upper end may correspond to the light blocking members 1011, 1012, 1021, 1022, 1031, and 1032 of FIG. 10B. That is, the light blocking member 370 may have lengths in the x axis and y axis directions large enough to completely divide regions corresponding to four sub-pixels into four regions.

According to example embodiments, the light blocking members 1111, 1112, 1121, 1122, 1131, and 1132 may correspond to light blocking members having smaller lengths in the x axis and y axis directions. That is, the light blocking members 1111, 1112, 1121, 1122, 1131, and 1132 may not completely divide the 2×2 AF pixel region into four regions. The light blocking members 1111, 1112, 1121, 1122, 1131, and 1132 may not be physically connected to a barrier between the 2×2 AF pixel and a pixel adjacent to the 2×2 AF pixel. Although the light blocking members 1111, 1112, 1121, 1122, 1131, and 1132 are used, since light that passes through a module lens and a lens of the 2×2 AF pixel concentrates on an intermediate point, the segregation ratio among the four regions may not change even though the light blocking member does not completely divide the 2×2 AF pixel region. In addition, in order to completely divide the regions corresponding to the first to fourth photoelectric transformation elements, when the light blocking members 1011, 1012, 1021, 1022, 1031, and 1032 are formed, the light blocking members 1111, 1112, 1121, 1122, 1131, and 1132 may be to be formed together with the barrier between the pixels adjacent to the 2×2 AF pixel in manufacturing processes. The light blocking member 1110 having a less length in the x axis and y axis directions may be generated by etching the barrier between the pixels adjacent to the 2×2 AF pixel in a subordinated process without simultaneously generating the barrier between the pixels adjacent to the 2×2 AF pixel and the light blocking member 1110 while previously etching the barrier between the pixels adjacent to the 2×2 AF pixel. Therefore, since a level of difficulty of the manufacturing processes may be reduced and the light blocking members 1111, 1112, 1121, 1122, 1131, and 1132 may be generated later, when a magnitude with which the light blocking members 1111, 1112, 1121, 1122, 1131, and 1132 are shifted is to be changed, the magnitude with which the light blocking members 1111, 1112, 1121, 1122, 1131, and 1132 are easily shifted may be changed.

According to example embodiments, it is illustrated that, in each of the pixel array 100 of FIG. 2, the pixel array 100 of FIG. 6, and the pixel array 100 of FIG. 10B, the pixel array includes the plurality of AF pixels and the plurality of normal pixels. However, embodiments are not limited thereto. For example, the pixel array 100 may include only the 2×1 AF pixel of FIG. 3B, the 3×1 AF pixel of FIG. 7A, or the 2×2 AF pixels of FIG. 10B. For example, the pixel array 100 may include a plurality of 2×1 AF pixels over the entire region. In another example, the pixel array 100 may include a plurality of 2×2 AF pixels over the entire region.

While example embodiments have been described with reference to the figures, it will be understood by those of ordinary skill in the art that various changes in form and details may be made therein without departing from the spirit and scope as defined by the following claims.

What is claimed is:

1. An image sensor comprising:
a pixel array comprising a plurality of auto focus (AF) pixels and a plurality of normal pixels,
wherein each of the plurality of AF pixels comprises two sub-pixels, a light blocking member provided between the two sub-pixels, and a lens corresponding to the two sub-pixels,
wherein the light blocking member is shifted from an intermediate point of the two sub-pixels,
wherein a distance by which the light blocking member is shifted is determined based on a position in which a first AF pixel corresponding to the light blocking member is provided in the pixel array, and
wherein a vertical length of the light blocking member is less than or equal to a vertical length of a light blocking member provided between the first AF pixel and a normal pixel adjacent to the first AF pixel, and is less than or equal to a vertical length of a light blocking member provided between adjacent normal pixels among the plurality of normal pixels.

2. The image sensor of claim 1, wherein the distance by which the light blocking member is shifted increases as the position of the first AF pixel corresponding to the light blocking member increases away from a center of the pixel array.

3. The image sensor of claim 1, wherein the vertical length of the light blocking member is determined based on a color filter provided at an upper end of the first AF pixel corresponding to the light blocking member.

4. The image sensor of claim 1, wherein a thickness of the light blocking member provided between the two sub-pixels included in the first AF pixel is less than or equal to a thickness of a light blocking member provided between the normal pixel adjacent to the first AF pixel and the first AF pixel.

5. The image sensor of claim 1, wherein a refractive index of the light blocking member provided between the two sub-pixels included in the first AF pixel is less than a refractive index of a photodiode region, and is less than or equal to a refractive index of a light blocking member provided between the normal pixel adjacent to the first AF pixel and the first AF pixel.

6. The image sensor of claim 1, wherein the light blocking member is not connected to a light blocking member provided between adjacent AF pixels among the plurality of AF pixels.

7. An image sensor comprising:
a pixel array comprising a plurality of auto focus (AF) pixels and a plurality of normal pixels,
wherein each of the plurality of AF pixels comprises a first sub-pixel, a second sub-pixel, and a third sub-pixel provided sequentially, a first light blocking member provided between the first sub-pixel and the second sub-pixel, a second light blocking member provided between the second sub-pixel and the third sub-pixel, and a lens corresponding to the first sub-pixel, the second sub-pixel, and the third sub-pixel, and
wherein the first light blocking member and the second light blocking member are respectively shifted from an intermediate point between the first sub-pixel and the second sub-pixel and an intermediate point between the second sub-pixel and the third sub-pixel.

8. The image sensor of claim 7, wherein distances by which the first light blocking member and the second light blocking member are respectively shifted are determined based on a position in which a first AF pixel corresponding to the first light blocking member and the second light blocking member is provided in the pixel array, and
wherein the distances by which the first light blocking member and the second light blocking member are shifted increases as the position of the first AF pixel increases away from a center of the pixel array.

9. The image sensor of claim 8, wherein a distance by which the first light blocking member is shifted is different from a distance the second light blocking member is shifted, and
wherein the distance by which a the second light blocking member is shifted is greater that the distance by which the first light blocking member is shifted, the first light blocking member being provided closer to the center of the pixel array than the second light blocking member.

10. The image sensor of claim 7, wherein a vertical length of the first light blocking member and a vertical length of the second light blocking member are respectively determined based on a color filter provided at an upper end of a first AF pixel corresponding to the first light blocking member and the second light blocking member.

11. The image sensor of claim 7, wherein a thickness of the first light blocking member and a thickness of the second light blocking member are respectively less than or equal to a thickness of a light blocking member provided between a normal pixel adjacent to a first AF pixel corresponding to the first light blocking member and the second light blocking member and the first AF pixel.

12. The image sensor of claim 7, wherein a refractive index of the first light blocking member and a refractive index of the second light blocking member are less than a refractive index of a photodiode region, and are less than or equal to a refractive index of a light blocking member provided between a normal pixel adjacent to a first AF pixel corresponding to the first light blocking member and the second light blocking member and the first AF pixel.

13. The image sensor of claim 7, wherein the first light blocking member and the second light blocking member are not connected to a light blocking member that divides adjacent AF pixels among the plurality of AF pixels.

14. An image sensor comprising:
a pixel array comprising a plurality of auto focus (AF) pixels and a plurality of normal pixels,
wherein each of the plurality of AF pixels comprises a first light blocking member comprising a first sub-pixel, a second sub-pixel adjacent to the first sub-pixel in a horizontal direction, a third sub-pixel adjacent to the first sub-pixel in a vertical direction, a fourth sub-pixel simultaneously adjacent to the second sub-pixel in the vertical direction and the third sub-pixel in the horizontal direction, the first light blocking member dividing each of the plurality of AF pixels in the vertical direction, a second light blocking member dividing each of the plurality of AF pixels in the horizontal direction, and a lens corresponding to the first sub-pixel, the second sub-pixel, the third sub-pixel, and the fourth sub-pixel, and
wherein the first light blocking member and the second light blocking member are respectively shifted from a horizontal intermediate point of each of the plurality of AF pixels and a vertical intermediate point of each of the plurality of AF pixels, and
wherein a thickness of the first light blocking member and a thickness of the second light blocking member are respectively less than or equal to a thickness of a light blocking member provided between a normal pixel adjacent to a first AF pixel and the first AF pixel.

15. The image sensor of claim 14, wherein a distance the first light blocking member is shifted is determined based on a distance by which a first AF pixel corresponding to the first light blocking member is spaced apart from a center of the pixel array in the vertical direction, and
wherein a distance the second light blocking member is shifted is determined based on a distance by which the first AF pixel further corresponding to the second light blocking member is spaced apart from the center of the pixel array in the horizontal direction.

16. The image sensor of claim 14, wherein a vertical length of the first light blocking member and a vertical length of the second light blocking member are less than or equal to a vertical length of a light blocking member provided between the first AF pixel and the normal pixel adjacent to the first AF pixel and a vertical length of a light blocking member provided between adjacent normal pixels among the plurality of normal pixels, and are respectively determined based on a color filter arranged at an upper end of the first AF pixel, and
wherein a refractive index of the first light blocking member and a refractive index of the second light blocking member are respectively less than a refractive index of a photodiode region and are less than or equal to a refractive index of a light blocking member provided between a normal pixel adjacent to the first AF pixel and the first AF pixel.

17. The image sensor of claim 14, wherein the first light blocking member and the second light blocking member are not connected to a light blocking member that divides adjacent AF pixels among the plurality of AF pixels.

* * * * *